(12) United States Patent
Munniksma

(10) Patent No.: US 6,653,825 B2
(45) Date of Patent: Nov. 25, 2003

(54) METER LEAD HOLDER DEVICE

(76) Inventor: Theodore G. Munniksma, 222 Westervelt Rd., Washington, NJ (US) 07882

( * ) Notice: Subject to any disclaimer, the term of this patent is extended or adjusted under 35 U.S.C. 154(b) by 99 days.

(21) Appl. No.: 09/995,953

(22) Filed: Nov. 29, 2001

(65) Prior Publication Data

US 2003/0098681 A1 May 29, 2003

(51) Int. Cl.[7] .............................................. G01R 31/02
(52) U.S. Cl. ........................ 324/72.5; 324/754; 324/762
(58) Field of Search ............................... 324/754, 762, 324/72.5

(56) References Cited

U.S. PATENT DOCUMENTS

| | | | |
|---|---|---|---|
| 4,165,270 A | 8/1979 | Ost et al. ................. 204/195 R |
| 4,305,207 A | 12/1981 | Lantz ............................ 33/174 |
| 4,343,092 A | 8/1982 | Wahl et al. ................ 33/169 R |
| 4,857,836 A | 8/1989 | Soelkner ...................... 324/96 |
| 4,908,568 A | 3/1990 | Soelkner ...................... 324/96 |
| 6,031,383 A | 2/2000 | Streib et al. ................ 324/754 |
| 6,124,723 A | 9/2000 | Costello ...................... 324/762 |
| 6,126,636 A | 10/2000 | Naka ........................... 604/116 |
| 6,248,101 B1 | 6/2001 | Whitmore, III et al. ......... 606/1 |
| 6,261,231 B1 | 7/2001 | Damphousse et al. ...... 600/437 |
| 6,285,180 B1 | 9/2001 | Pas ............................ 324/72.5 |
| 6,305,230 B1 * | 10/2001 | Kasukabe et al. ............. 73/855 |
| 6,478,028 B1 * | 11/2002 | Paolitto et al. ............. 128/898 |

* cited by examiner

Primary Examiner—N. Le
Assistant Examiner—John Teresinski
(74) Attorney, Agent, or Firm—Kenneth P. Glynn, Esq.

(57) ABSTRACT

The present invention is a meter lead holder device. It includes a base, arm securing mechanism attached to the base, and a first arm having a first end and a second end. The first arm is movably connected to the arm securing mechanism, as well as being moveable in at least a first plane relative to the arm securing mechanism. A meter lead holding mechanism for holding a meter lead is located at the second end of the first arm. Rotation mechanism is connected to at least two of the base, the arm securing mechanism, the first arm and the meter lead holding means. The rotation mechanism is adapted for rotation of the meter lead holder device relative to the base, and includes a locking mechanism for locking and unlocking the first arm in a plurality of positions relative to the arm securing mechanism.

16 Claims, 3 Drawing Sheets

METER LEAD HOLDER DEVICE

BACKGROUND OF THE INVENTION

1. Field of the Invention

The present invention relates to meter lead holders, and, more particularly, to those holders that have arms connectible to a probe. The arms may move in different planes relative to a base, an arm securing means and each other. The meter lead holder may include a probe which is spring loaded so that pressure of the probe connector against a meter or a terminal mechanically keeps the probe in place. In addition, the meter lead holder may include a spring loaded housing for a probe that is located partially within the housing.

2. Information Disclosure Statement

There are many patents related to probe holders. The following is representative of the art:

U.S. Pat. No. 6,285,180 to Pas discloses an apparatus for precisely positioning and thereafter holding a probe connected to an oscilloscope or the like. The apparatus enables a single operator to position the probe and read and adjust the oscilloscope. The apparatus has a rod like means about which a nonconducting probe holder enjoys several degrees of freedom. The rod is connected to a weighted base by a clamp through which the rod may slide as part of the gross positioning of the assembly and which clamp can be adjusted to finely position the rod and probe clamp assembly.

U.S. Pat. No. 6,261,231 relates to an apparatus for holding a probe and a method for using the same. The apparatus comprises a body portion having a longitudinal bore and a membrane holder positioned over a first end of a body portion. The membrane holder defines an opening which is covered by a membrane. A receptacle for receiving the probe is rotatably positioned within the longitudinal bore of the body portion at a second end of the body portion. The membrane, membrane holder, body portion, receptacle, and probe define a sealed chamber for containing a contacting medium.

U.S. Pat. No. 6,248,101 to Whitmore, III et al. describes and illustrates an apparatus for supporting and facilitating accurate positioning, both linearly and angularly of a medical device such as and ultrasound probe, a medical instrument or an imaging device. The apparatus is capable of both gross and precise multidirectional movements with the medical device attached, while remaining connected to stationary objects such as a portable floor stand and/or operating table. After gross manual placement and approximate positioning, the fine tune mechanism of the attached medical device is locked in position and secured to two fixed points. Exact positioning is then achieved by the precision movements which are available in all three linear directions and rotational axes. By this arrangement which allows preattachment of the medical device or instrument (i.e., an ultrasound probe) to the apparatus prior to positioning in the patient, quicker, more accurate and more reproducible medical device positioning and placement are achieved. In one preferred embodiment, the apparatus provides for multidirectional adjustment including a plurality of translational and one rotational adjustment.

U.S. Pat. No. 6,126,636 relates to a method and device for accurately positioning a measuring means such as a measurement probe relative to that target area of a living body which has a unique marking peculiar to the living body. A transparent sheet member is first applied to the target part, and an image of the unique marking is then transferred onto the transparent sheet member. The transparent sheet member bearing the image of the unique marking is associated with the measuring device so that a subsequent measurement can be performed by the measuring device after the image transferred onto the transparent sheet member has been aligned with the unique marking in the target area.

U.S. Pat. No. 6,124,723 to Costello relates to a probe holder for a wafer probe station. It is comprised of a pair of over-and-under rigid extensions, one of which receives the probe shank. The other is connected to the probe to make a Kelvin connection. The two coaxial extensions are supported by a vertical tube which contains a pair of coaxial cables connected to triaxial cables outside of the probe station enclosure.

U.S. Pat. No. 6,031,383 describes and illustrates a probe station having probe manipulators with probe supports disposed around a cover assembly with an inspection opening. Each probe support has a vertical tube extending through an opening in the cover assembly and a horizontal adjustable member extending radially inwardly and supporting a probe holder. Each such horizontal member may be angularly and longitudinally adjusted with respect to its vertical tube. Pairs of coaxial guarding cables run inside the vertical tubes and make Kelvin connections to the probe holders.

U.S. Pat. No. 4,908,568 to Soelkner discloses a mechanical probe for optical measurement of electrical potentials. The probe of the present invention is composed of a cubic, electro-optical crystal fashioned in the form of a tip and of a metallization which is at ground potential and which covers the crystal with the exception of those surface regions located immediately opposite a measuring location, for example an interconnect of an integrated circuit. Since the metallization acting as a cooperating electrode significantly facilitates the penetration if the electrical stray field into the crystal tip, geometry-dependent effects and influences of electrical microfields are nearly completely suppressed. The probe therefore makes it possible to utilize the voltage difference for optical measurement of electrical signals with high chronological resolution.

U.S. Pat. No. 4,857,836 relates to a mechanical probe for optical measurement of electrical signals. The probe for optical measurement of electrical signals with high chronological resolution is composed of a cuboid electro-optical crystal, of a co-planar waveguide structure located on a lateral face of the crystal and of a metallic tip applied to the end face of the crystal adjacent a measuring location. The signal at the measuring location, for example at an interconnect of an integrated circuit is taken with the metallic tip and is fed into the co-planar waveguide structure composed of two strip-shaped metallizations. Probe is holders or electrostrictive manipulators known in the art of electrical metrology (probe measuring location) can be used for exact positioning of the probe onto the measuring location.

U.S. Pat. No. 4,343,092 discloses a probe guide for holding a coating thickness measurement probe in contact with a coated workpiece such that repeatable thickness measurements may be made without the necessity of the user manually positioning the probe head for proper contact. The probe guide having a probe holding assembly constructed to permit the probe to swivel freely in any direction about the geometric center of the probe head face. A workpiece holding means is provided for holding the workpiece against a probe head of the probe. By positioning the workpiece holding means for forcibly move the workpiece into contact with the probe head face, the probe will swivel until the resultant vector through the center of movement of the static forces through the workpiece acting on the probe head at the point or points of the probe head passes through the geometric center of the probe head face. With this construction, repeatable thickness measurements may be made and the probe may be used to measure coatings on workpieces which have complex shapes such as jewelry items and turbine blades.

U.S. Pat. No. 4,305,207 to Lantz describes and illustrates a three-axis coordinate inspection machine. A pair of parallel Z axis rails are mounted atop a bearing plate having an upwardly facing horizontal bearing surface. A single X axis rail has opposite ends slidably and bearingly mounted to the Z axis rail. The X axis rail extends through a carrier which is supported by the bearing surface of the bearing plate. A vertically extending column is mounted to the carrier and slidably holds in the vertical direction one or more inspection probes which may in turn be moved along the length of the X axis and Z axis rails.

U.S. Pat. No. 4,165,270 to Ost et al. relates to an electrolytic apparatus for the simultaneous non-destructive testing of the integrity of pluralities of circuit boards for continuity and anti-continuity or short circuits, including such circuit boards as employ multi-layer or multi-level interconnection wiring, whether it be printed wiring or screen printed or thermally deposited circuits. Transient electro-deposition of one ion from an alkali halide water solution temporarily modifies the optical reflectivity of exposed circuit terminals or metal parts of the circuit boards under test in a characteristic and easily recognized manner according to the continuity status of the associated circuit paths.

Notwithstanding the above cited prior art, the present in neither taught nor rendered obvious thereby.

SUMMARY OF THE INVENTION

The present invention is a meter lead holder device. It includes a base, arm securing means attached to the base, and a first arm having a first end and a second end. The first arm is movably connected to the arm securing means, as well as being moveable in at least a first plane relative to the arm securing means. A meter lead holding means for holding a meter lead is located at the second end of the first arm.

Rotation means is connected to at least two of the base, the arm securing means, the first arm and the meter lead holding means. The rotation means is adapted for rotation of the meter lead holder device relative to the base, and includes a locking mechanism for locking and unlocking the first arm in a plurality of positions relative to the arm securing means.

Finally, there is attachment means connected to the base for attachment thereof to a stationary site. The attachment means may be C-suction cups, magnets, C-clamps, clips and the like.

The rotation means may be lockable universal joints, ball joints, lockable swivel joints and the like. The meter lead holding means may be pinch holders, clips, pinch holders with springs and the like.

In some embodiments, there is a second arm connected to the first arm and being moveable in at least a second plane relative to the second arm. It also has rotation means connected to at least two of the first arm, the second arm, and the meter lead holding means.

In some embodiments, a probe having a spring loaded housing is used in conjunction with the present invention meter lead holder device. An arm of a meter lead holder device is connected to a spring loaded housing which includes a first housing for a probe. Probe housing is partially embedded in the spring loaded housing. A meter end connector and a wire terminal connector extend from within the probe housing to beyond the probe housing.

The spring loaded housing includes an outer wall, a rotatable handle extending from an outer side of the spring loaded housing through the outer wall into an inner part of the spring loaded housing. A screw is attached to the rotatable handle and is sized and shaped to abut the first housing such that when the rotatable handle is rotated, the screw moves the first housing toward an opposite side of the spring loaded housing from the rotatable handle.

A spring means is located within the spring loaded housing and cooperates with a moveable inner wall attached to the spring means. There is a stop means extending from an outer wall of the spring loaded housing into the inner portion. The stop means is located one of below and above the moveable inner wall. The spring loaded housing further includes a stationary inner wall one of above and below the spring for maintaining movement by the spring in only one direction.

In operation, when the rotatable handle is rotated, the screw moves the first housing toward the inner moveable wall and pushes against the spring. The force against the spring creates movement in the spring such that the spring pushes the inner moveable wall one of downwardly or upwardly toward the stop. By the force of the spring being stopped by the stop, tension is created so that at least one of a meter end connector and a wire terminal end connector remain in place, independently of other control, once at least one of the ends has been placed in at least one of the meter and the terminal.

Still yet a spring loaded probe having a probe housing, is also used in conjunction with the present invention meter lead holder device. The probe housing includes a meter end connector and a wire terminal connector extending through the probe housing. Within an inner portion of the probe housing, there is a spring cooperating with the meter end connector of the probe. A spring mover means is located one of above and below the meter end connector and cooperates with the meter end connector. When the spring mover means is pushed one of upward or downward, the spring compresses, thus causing tension on the meter end connector.

BRIEF DESCRIPTION OF THE DRAWINGS

The present invention should be more fully understood when the specification herein is taken in conjunction with the drawings appended hereto wherein:

FIG. 5 shows a partial cross section view of spring loaded probe used in conjunction with the present invention meter lead holder device while

DETAILED DESCRIPTION OF THE PRESENT INVENTION

The present invention relates to meter lead holders, and, more particularly, to those holders that have arms connectible to a probe. The arms may move in different planes relative to an arm securing means and each other. The meter lead holder may include a probe which is spring loaded so that pressure of a probe connector against a meter or a terminal mechanically keeps the probe in place. In addition, the meter lead holder may include a spring loaded housing for a probe that is located partially within the housing.

The meter lead holder device permits one to adjust the three dimensional position of a probe so that a probe connector may be aligned with a meter and a terminal without any other means, thereby allowing one to make other adjustments using one or both hands.

When the spring loaded probe or the spring loaded housing for a probe is used in conjunction with the present invention, the placement with the meter and the terminal is made even more secure by creating a tension on the connector.

The device includes a base, arm securing means attached to the base, and a first arm having a first end and a second end. The first arm is movably connected to the arm securing means, as well as being moveable in at least a first plane relative to the arm securing means. A meter lead holding means for holding a meter lead is located at the second end of the first arm.

Rotation means is connected to at least two of the base, the arm securing means, the first arm and the meter lead holding means. The rotation means is adapted for rotation of the meter lead holder device relative to the base, and includes a locking mechanism for locking and unlocking the first arm in a plurality of positions relative to the arm securing means.

Finally, there is attachment means connected to the base for attachment thereof to a stationary site. The attachment means may be C-suction cups, magnets, C-clamps, clips and the like.

The rotation means may be lockable universal joints, ball joints, lockable swivel joints and the like. The meter lead holding means may be pinch holders, clips, pinch holders with springs and the like.

In some embodiments, there is a second arm connected to the first arm and being moveable in at least a second plane relative to the first arm. It also has rotation means connected to at least two of the first arm, the second arm, and the meter lead holding means.

The meter lead holder device may be made from a nonconductive material or plastic material.

Figure 1:
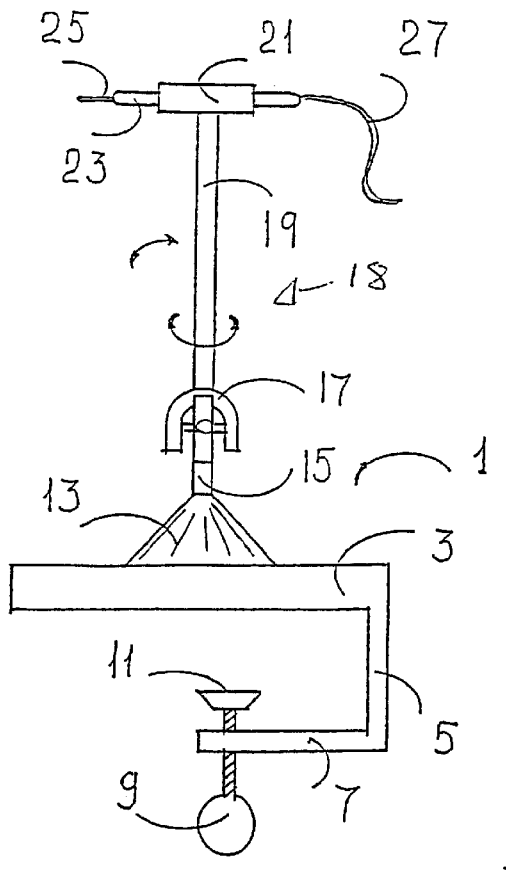
FIG. 1 shows a front view of a present invention meter lead holder device having a lockable universal joint rotation means.

FIG. 1 shows a front view of a present invention meter lead holder device 1 having a lockable universal joint rotation means 17. The meter lead holder device 1 includes a base 3 with a first extension 5 approximately perpendicular to the base 3 and a second extension 7 approximately parallel to the base 3.

Attached to the second extension 7 is attachment means which is connected to the second extension 7 of the base 3 for attachment of the device 1 to a stationary site. In this case, attachment means is a screw 9, which passes through the second extension 7, and a screw holder 11. Thus, a user may tighten the screw 9 against a stationary means such as against an electrical panel, panel door or other nearby stationary object, so that the device 1 is stationary and secure.

Attached to the base 3 is arm securing means 13. In this case, the arm securing means 13 is conical-shaped. However, any shape may be used for this part. The arm securing means 13 provides a junction between the base 3 and a first arm 18.

The first arm 18 has a first end 15 and a second end 19. The first arm 18 is movably connected to the arm securing means 13 at the first end 15 such that the first arm 18 is moveable in at least a first plane relative to the arm securing means 13. As shown, the first arm may move in a horizontal direction relative to the arm securing means 13, in a vertical direction relative to the arm securing means 13, or in any direction therebetween.

A meter lead holding means 21 is located at the second end 19 of the first arm 18. In this case meter holding means 21, is a pinch holder, which may have a spring and variable diameter. The meter lead holding means 21 is sized and shaped to hold a probe housing 23.

A rotation means 17 is connected to the arm securing means 13 and the first arm 18. The rotation means 17 is adapted for rotation of the meter lead holder device 1 relative to the base 3. In this case, the rotation means 17 is a lockable universal joint, which includes a locking mechanism for locking and unlocking the first arm 18 in a plurality of positions relative to the arm securing means 13.

In operation a probe which includes a meter end connector 25, a wire terminal end connector 27 and the probe housing 23 is placed connected to the meter lead holding means 21. The first arm 18 is rotated and locked at the lockable universal joint in a position that allow for the meter end connector 25 and the wire terminal end connector 27 to be aligned with the meter and the terminal, respectively. Thus, the meter lead holder device 1 provides a solid support upon which to hold the probe in place at variable placements, so that a user is free to make other adjustments.

Figure 2:
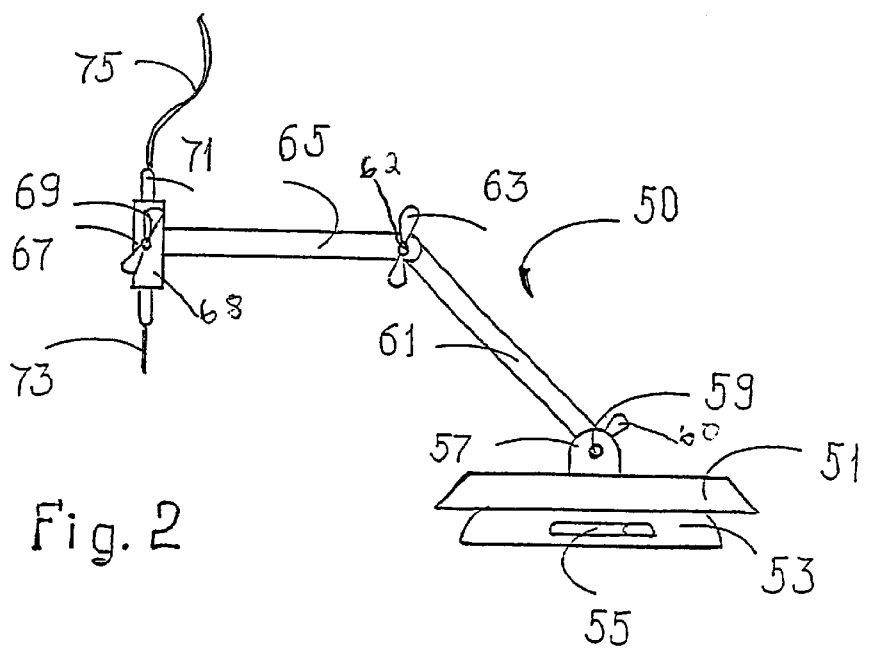
FIG. 2 shows a front view of another embodiment of a present invention meter lead holder device having two arms and ball joint rotation means.

FIG. 2 shows a front view of another embodiment of a present invention meter lead holder device 50 having a first arm 61, a second arm 65, and ball joint rotation means 59, 62 and 69. The meter lead holder device 50 includes base 51 having attachment means, in this case, a lower portion 53 attached to the base 51. The base lower portion includes a suction cup 55, which secures the meter lead holder device 50 in place to a stationary object.

Arm securing means 57 is attached to the base 51 and the first arm 61. The first arm 61 has a first end and a second end, and is movably connected to the arm securing means 57 at the first end. The first arm 61 is moveable in at least a first plane relative to the arm securing means 57.

Moreover, there is a second arm 65 having a first end and a second end. The second arm 65 is movably connected to the first arm 61 at the second arm first end. The second arm 65 is moveable in at least a second plane relative to the first arm 61.

A meter lead holding means 68 is located at the second end of the second arm 65. The meter lead holding means 68 is sized and shaped to hold a probe housing 71. A probe includes the probe housing 71, a meter end connector 73 and a wire terminal end connector 75.

A first rotation means 59 is connected to the arm securing means 57, and the first arm 61, and is adapted for rotation of the first arm 61 relative to the base 51. The first rotation means 59, in this case, a ball joint, has a first locking mechanism 60 for locking and unlocking the first arm 61 in a plurality of positions relative to the arm securing means 57.

A second rotation means 62 is connected to the first arm 61 and the second arm 65, and is adapted for rotation of the meter lead holder device 50 relative to the base 51. The second rotation means 62, in this case, a ball joint, has a second locking mechanism 63 for locking and unlocking the second arm 65 in a plurality of positions relative to the first arm 61.

A third rotation means 67 is connected to the second arm 65 and the meter lead holding means 68 and is adapted for rotation of the meter lead holding means 68 relative to the second arm 65. The third rotation means 67, in this case, a ball joint, has a third locking mechanism 69 for locking and unlocking the meter lead holding means 68 in a plurality of positions relative to the second arm securing means 65.

Figure 3:
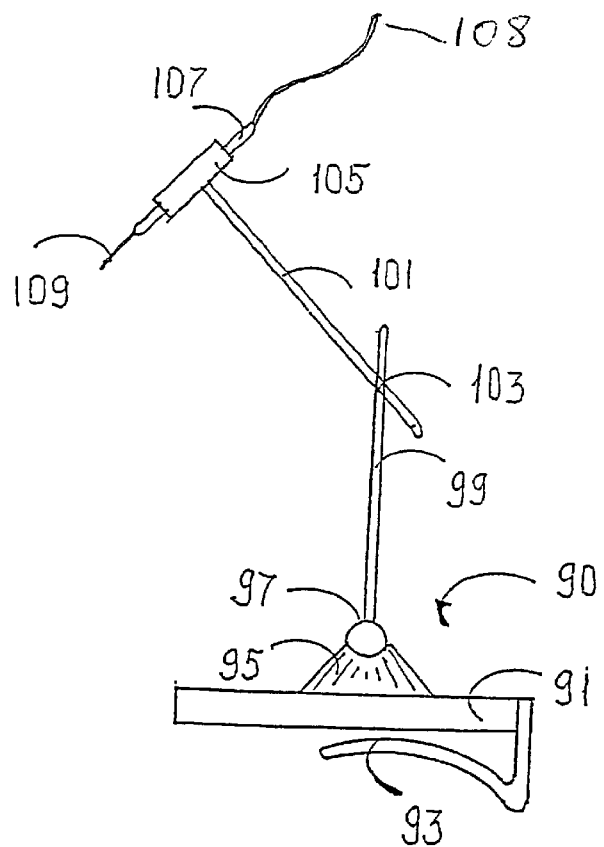
FIG. 3 shows a front view of another embodiment of a present invention meter lead holder device having two arms and swivel rotation means.

FIG. 3 shows a front view of another embodiment of a present invention meter lead holder device 90 having a first arm 99 and a second arm 101, and swivel rotation means 97. The meter lead holder device 90 includes base 91 and attachment means 93, in this case, a C-clamp, for attachment of the device 90 to a stationary object.

Arm securing means 95 is connected to the base 91 and the first arm 99. The first arm 99 is movably connected to the arm securing means 95 and is moveable in at least a first plane relative to the arm securing means 95. Moreover, there is a second arm 101 movably connected to the first arm 91 and being movable in at least a second plane relative to the first arm 91.

A meter lead holding means 105 is located at an end of the second arm 101. The meter lead holding means 105 is sized and shaped to hold a probe housing 107. A probe includes the probe housing 107, a meter end connector 109 and a wire terminal end connector 108.

The first rotation means 97 is connected to the arm securing means 95, and the first arm 99, and is adapted for rotation of the first arm 99 relative to the base 91. The first rotation means 97, in this case, a ball joint has a first locking mechanism, in this case, within the ball joint, for locking and unlocking the first arm 99 in a plurality of positions relative to the arm securing means 95.

A second rotation means 103 is connected to the first arm 99 and the second arm 101, and is adapted for rotation of the second arm 101 relative to the base 91. The second rotation means 101, in this case a ball joint, has a second locking mechanism, in this case, included in the second rotation means, for locking and unlocking the second arm 101 in a plurality of positions relative to the first arm 99.

The operation of the embodiments shown in FIG. 2 and FIG. 3 are similar to that described by FIG. 1 herein above. However, in these embodiments, there is rotation of at least two members in multiple planes.

Figure 4:
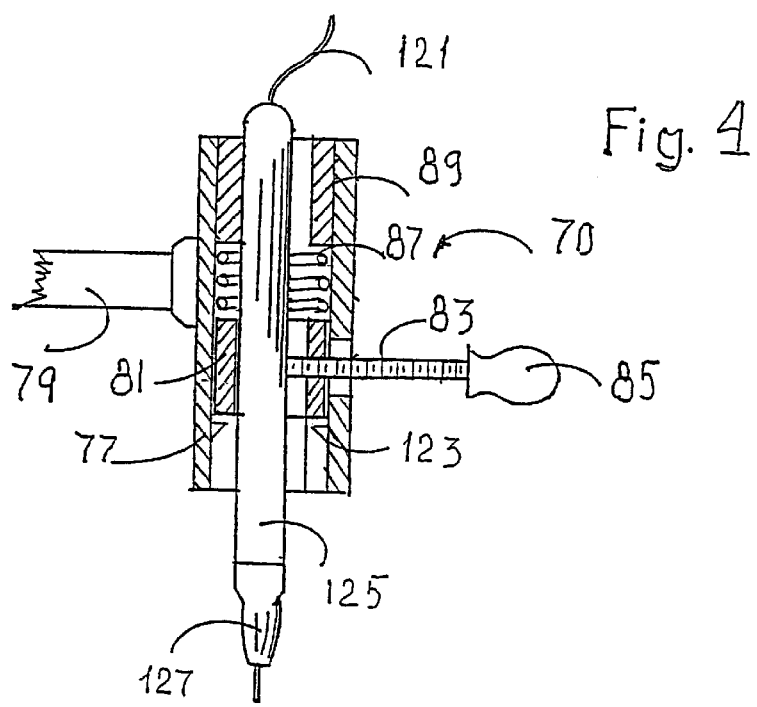
FIG. 4 shows a probe having a spring loaded housing used in conjunction with the present invention meter lead holder device.

FIG. 4 shows a probe having a spring loaded housing 70 used in conjunction with the present invention meter lead holder device. An arm 79 of a meter lead holder device is connected to a spring loaded housing 70 which includes a first housing 125 for a probe. Probe housing 125 is partially embedded in the spring loaded housing 70. A meter end connector 125 and a wire terminal connector 121 extend from within the probe housing 125 to beyond the probe housing.

The spring loaded housing 70 includes an outer wall 77, a rotatable handle 85 extending from an outer side of the spring loaded housing 70 through the outer wall 77 into an inner part of the spring loaded housing 70. A screw 83, is attached to the rotatable handle 85 and is sized and shaped to abut the first housing 125 such that when the rotatable handle 85 is rotated, the screw 83 moves the first housing 125 toward an opposite side of the spring loaded housing 70 from the rotatable handle 85.

A spring means 87 is located within the spring loaded housing 70 and cooperates with a moveable inner wall 81 attached to the spring means 97. There is a stop means 123 extending from an outer wall of the spring loaded housing 70 into the inner portion. The stop means 123 is located one of below and above the moveable inner wall 81. The spring loaded housing 70 further includes a stationary inner wall 89 one of above and below the spring for maintaining movement by the spring 87 in only one direction.

In operation, when the rotatable handle 85 is rotated, the screw 83 moves the first housing 125 toward the inner moveable wall 81 and pushes against the spring 87. The force against the spring 87 creates movement in the spring 87 such that the spring 87 pushes the inner moveable wall 81 one of downwardly or upwardly toward the stop 123. By the force of the spring 87 being stopped by the stop 123, tension is created so that at least one of the meter end connector 127 and the wire terminal end connector 121 remain in place, independently of other control, once at least one of the ends 127, 121 has been placed in at least one of the meter and the terminal.

Figure 5:
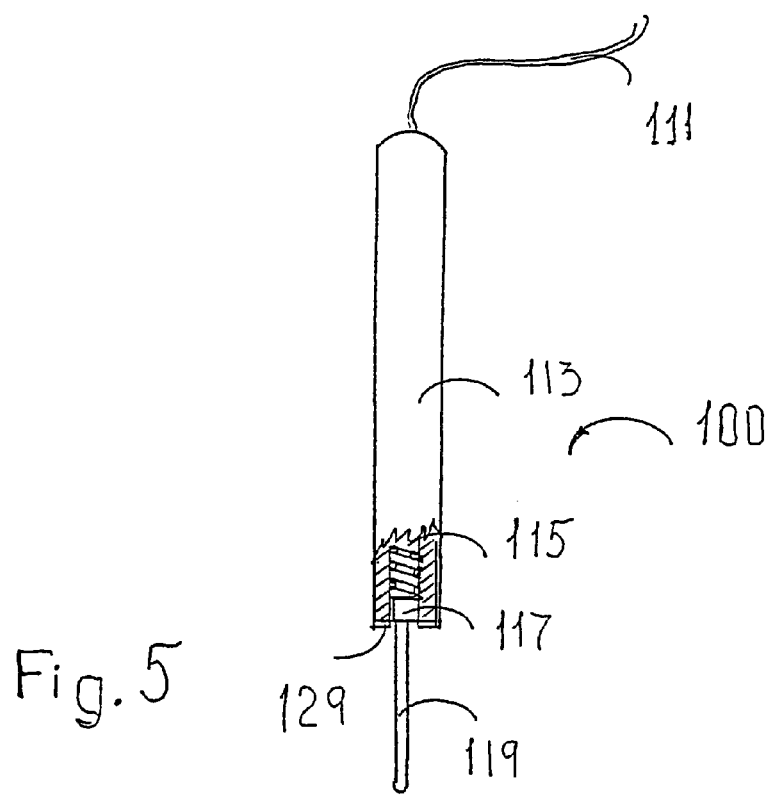
Figure 6:
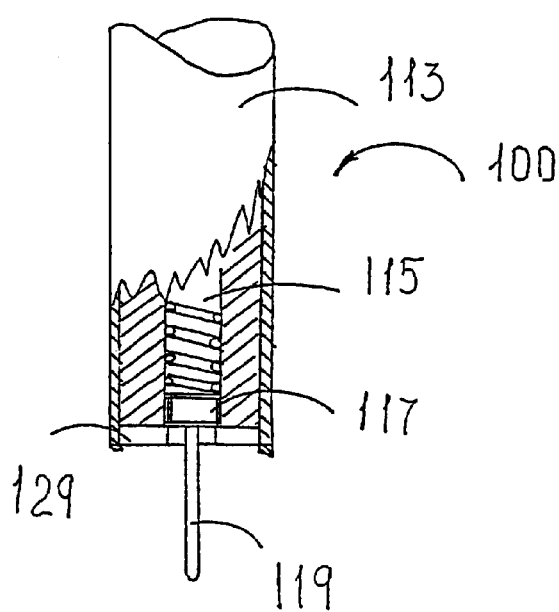
FIG. 6 shows a blown-up view of a section thereof.

FIGS. 5 and 6 show a spring loaded probe 100 having a probe housing 113, which is used in conjunction with the present invention meter lead holder device. The probe housing 113 includes a meter end connector 119 and a wire terminal connector 111 extending through the probe housing 113. Within an inner portion of the probe housing 113, there is a spring 115 cooperating with the meter end connector 119 of the probe 100. A spring mover means 117 is located one of above and below the meter end connector 119 and cooperates with the meter end connector 119. When the spring mover means 117 is pushed one of upward or downward, the spring 115 compresses, thus causing tension on the meter end connector 119.

In operation, when the meter end connector 119 is in contact with a meter such that there is tension on the meter end connector 119, the spring mover means 117 is pushed, thereby causing the spring 115 to become stressed and to cause tension in the meter end connector 119. In this way the meter end connector 119 remains in contact without any other intervention.

Obviously, numerous modifications and variations of the present invention are possible in light of the above teachings. For example, any shaped arm securing means is envisioned within the scope of the current invention. It is, therefore, understood that within the scope of the appended claims, the invention may be practiced otherwise than as specifically described herein.

What is claimed is:

1. A meter lead holer device, which comprises:
   (a) a base;
   (b) arm securing means attached to said base;
   (c) a first arm having a first end and a second end, and being movably connected to said arm securing means at said first end, said first arm being moveable in at least a first plane relative to said arm securing means;
   (d) meter lead holding means at said second end of said first arm;
   (e) rotation means connected to at least two of said base, said arm securing means, said first arm and said meter lead holding means, adapted for rotation of said meter lead holder device relative to said base, and having a locking mechanism for locking and unlocking said first arm in a plurality of positions relative to said arm securing means;
   (f) attachment means connected to said base for attachment thereof to a stationary site; and, (g) a probe connected to said meter lead holding means, said probe including meter end connector, terminal end connector and a first housing for a portion of said connectors, wherein said probe is at least partially embedded in a second housing wherein said second housing includes:
  (i) an outer wall;
  (ii) a rotatable handle extending from an outer side of said second housing through said outer wall into said second housing;
  (iii) a screw attached to said rotatable handle wherein said screw cooperates with said handle and abuts said first housing such that when said rotatable handle is rotated, said screw moves said first housing toward an opposite side of said second housing from said rotatable handle;
  (iv) spring means located in an inner portion of said housing and cooperating with a moveable inner wall;
  (v) moveable inner wall attached to said spring means; and,
  (vi) stop means extending from said outer wall of said second housing into said second housing, and being located one of below and above said moveable inner wall;
such that when said rotatable handle is rotated, said screw moves said first housing toward said inner moveable wall and pushes against said spring thereby creating tension in said spring such that said spring pushes said inner moveable wall one of downwardly or upwardly toward said stop, wherein said first housing, by force of said spring being stopped by said stop, remains in at least one of a meter and a probe terminal, independently of other control, once said probe connector has been placed in at least one of said meter and said terminal.

2. The meter lead holder device of claim 1 wherein said rotation means is selected from the group consisting of lockable universal joints, ball joints, and lockable swivel joints.

3. The meter lead holder device of claim 1 wherein said attachment means is selected from the group consisting of suction cups, magnets, C-clamps and clips.

4. The meter lead holder device of claim 1 wherein said meter lead holding means is selected from the group consisting of pinch holders, clips, and pinch holders with springs.

5. The meter lead holder device of claim 1 wherein said device is made from the group consisting of non-conducive materials and plastics.

6. The meter lead holder device of claim 1 wherein said arm securing means is conical shaped.

7. The meter lead holder device of claim 1 wherein said first housing includes a spring for maintaining pressure of one of said meter connector and said terminal end connector against one of a terminal and a meter.

8. The meter lead holder device of claim 1 wherein said second housing further includes a stationary inner wall one of above and below said spring.

9. A meter lead holder device, which comprises:
  (a) a base;
  (b) arm securing means attached to said base;
  (c) a first arm having a first end and a second end, and being movably connected to said arm securing means at said first end, said first arm being moveable in at least a first plane relative to said arm securing means;
  (d) a second arm having a first end and a second end, and being movably connected to said first arm at said second arm first end, said second arm being moveable in at least a second plane relative to said first arm;
  (e) meter lead holding means at said second end of said second arm;
  (f) first rotation means connected to at least two of said base, said arm securing means, and said first arm, adapted for rotation of said first arm relative to said base, and having a first locking mechanism for locking and unlocking said first arm in a plurality of positions relative to said arm securing means; and a second rotation means connected to at least two of said first arm, said second arm and said meter lead holding means, adapted for rotation of said meter lead holder device relative to said base, and having a second locking mechanism for locking and unlocking said second arm in a plurality of positions relative to said first arm;
  (g) attachment means connected to said base for attachment thereof to a stationary site; and,
  (h) a probe connected to said meter lead holding means, said probe including meter end connector, terminal end connector and a first housing for a portion of said connectors, wherein said probe is at least partially embedded in a second housing wherein said second housing includes:
    (i) an outer wall;
    (ii) a rotatable handle extending from an outer side of said second housing through said outer wall into said second housing;
    (iii) a screw attached to said rotatable handle wherein said screw cooperates with said handle and abuts said first housing such that when said rotatable handle is rotated, said screw moves said first housing toward an opposite side of said second housing from said rotatable handle;
    (iv) spring means located in an inner portion of said housing and cooperating with a moveable inner wall;
    (v) moveable inner wall attached to said spring means; and,
    (vi) stop means extending from said outer wall of said second housing into said second housing, and being located one of below and above said moveable inner wall;
  such that when said rotatable handle is rotated, said screw moves said first housing toward said inner moveable wall and pushes against said spring thereby creating tension in said spring such that said spring pushes said inner moveable wall one of downwardly or upwardly toward said stop, wherein said first housing, by force of said spring being stopped by said stop, remains in at least one of a meter and a probe terminal, independently of other control, once said probe connector has been placed in at least one of said meter and said terminal.

10. The meter lead holder device of claim 9 wherein said rotation means is selected from the group consisting of lockable universal joints, ball joints, and lockable swivel joints.

11. The meter lead holder device of claim 9 wherein said attachment means is selected from the group consisting of suction cups, magnets, C-clamps and clips.

12. The meter lead holder device of claim 9 wherein said meter lead holding means is selected from the group consisting of pinch holders, clips, and pinch holders with springs.

13. The meter lead holder device of claim 9 wherein said device is made from the group consisting of non-conducive materials and plastics.

14. The meter lead holder device of claim 9 wherein said arm securing means is conical shaped.

15. The meter lead holder device of claim 9 wherein said first housing includes a spring for maintaining pressure of one of said meter connector and said terminal end connector against one of a terminal and a meter.

16. The meter lead holder device of claim 9 wherein said second housing further includes a stationary inner wall one of above and below said spring.

* * * * *